(12) United States Patent
Dallavalle

(10) Patent No.: US 6,768,649 B2
(45) Date of Patent: Jul. 27, 2004

(54) METHOD AND A CIRCUIT SYSTEM FOR USING EQUIVALENT INTEGRATED-CIRCUIT DEVICES OPERATING AT DIFFERENT VOLTAGES

(75) Inventor: Carlo Dallavalle, Vimercate (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 381 days.

(21) Appl. No.: 09/848,615

(22) Filed: May 3, 2001

(65) Prior Publication Data

US 2002/0022402 A1 Feb. 21, 2002

(30) Foreign Application Priority Data

May 4, 2000 (EP) .............................................. 00830323

(51) Int. Cl.[7] ................................................ H05K 1/18
(52) U.S. Cl. ...................................... 361/764; 361/760
(58) Field of Search ................................ 361/760–764; 307/151; 365/189.09, 51; 327/564–566; 323/222, 266

(56) References Cited

U.S. PATENT DOCUMENTS

| 5,132,555 | A | | 7/1992 | Takahashi ................ 307/296.1 |
|---|---|---|---|---|
| 5,444,298 | A | | 8/1995 | Schutz ........................ 257/691 |
| 5,556,811 | A | | 9/1996 | Agatstein et al. ............ 437/209 |
| 5,627,460 | A | * | 5/1997 | Bazinet et al. ............... 323/288 |
| 6,469,895 | B1 | * | 10/2002 | Smith et al. ................. 361/704 |
| 6,504,735 | B2 | * | 1/2003 | Negru et al. ................... 363/25 |
| 6,515,918 | B2 | * | 2/2003 | Mizuno et al. ......... 365/189.09 |

* cited by examiner

*Primary Examiner*—David A. Zarneke
*Assistant Examiner*—Tuan Dinh
(74) *Attorney, Agent, or Firm*—Lisa K. Jorgenson; Harold H. Bennett II; Seed IP Law Group PLLC

(57) ABSTRACT

The circuit system includes an integrated circuit which is one of a family of equivalent integrated circuits that comprises a first-generation integrated circuit operating at the supply voltage of the circuit system and at least one subsequent-generation integrated circuit having a portion operating at a lower voltage. The first-generation integrated circuit has a direct electrical connection between one of the supply terminals and another terminal. The subsequent-generation integrated circuit has a voltage reducer with regulator the output of which is connected to the other terminal. A filter capacitor is connected between the other terminal and one of the supply terminals.

8 Claims, 2 Drawing Sheets

METHOD AND A CIRCUIT SYSTEM FOR USING EQUIVALENT INTEGRATED-CIRCUIT DEVICES OPERATING AT DIFFERENT VOLTAGES

This application claims the priority of European Patent Application Number 00830323.2, filed May 4, 2000.

TECHNICAL FIELD

The present invention relates to the manufacture of circuit systems containing integrated-circuit devices and, more particularly, to a circuit and method of using, in a circuit system which is designed to operate with a first integrated-circuit device operating at a first supply voltage, a second integrated-circuit device having the same functional characteristics as the first device and comprising at least a portion operating at a second supply voltage.

BACKGROUND OF THE INVENTION

It is known that, in the manufacture of integrated circuits, there is a tendency to reduce as far as possible the area of the substrate of semiconductor material, typically silicon, in which the integrated circuit is formed. The reduction in size is achieved by the use of more and more refined techniques and tooling which increase the precision of the photolithographic processes and improve control over diffusion.

In the manufacture of MOS digital integrated circuits, the development of the technology is evident basically as a reduction in the minimum channel length which can be achieved for the transistors both of the logic circuits and of the memory cells, and as a reduction in the depth of the diffused source and drain regions of the transistors. These dimensional reductions are advantageous not only because of the saving in area involved, but also because of some functional aspects such as lower energy consumption and faster speed of operation.

However, there are cases in which it is not possible to make use of these advantages. An example is a digital integrated circuit designed to perform a certain function as a component of a complex circuit system which is mounted, together with other components, on a printed circuit board. The supply voltage of the integrated circuit is set at the design stage at an optimal value which is determined by the minimum length of the channels of the transistors of the logic circuits. If the integrated circuit as a whole, or a portion thereof, is reproduced on a reduced scale with the use of more advanced manufacturing techniques, the optimal supply voltage is also reduced. For example, upon changing from 0.35 $\mu$m technology, which requires a supply voltage of 3.3 V±10%, to 0.25 $\mu$m technology, the supply voltage must be reduced to 2.5 V±10%. In order to use a new-generation integrated circuit in the circuit system which was designed for using the integrated circuit of the preceding generation, it is necessary to modify the printed circuit board, for example, by adding a voltage reducer thereto. This modification is necessary when the average life of the product which contains the circuit system is longer than that of the technology by which the integrated circuits used therein are produced. (Currently, the life of a technological generation is slightly less than one year.) It is therefore sometimes necessary to forego the advantages of technological progress and to keep obsolete production lines in operation to provide the supplies and the spare parts which are required by the manufacturers of the products, or to modify the circuit systems contained in these products in order to adapt them to equivalent new-generation integrated circuits. The first solution is disadvantageous for the manufacturer of the integrated-circuit devices and the second is disadvantageous for the manufacturer of the circuit systems; naturally, both of these solutions adversely affect the cost of the product.

SUMMARY OF THE INVENTION

The object of the present invention is to define a method and to provide a circuit system to enable integrated-circuit devices of different generations to be used in the same circuit system without modifications or adaptations.

According to one embodiment of the invention, a circuit system is provided, configured to accommodate an integrated circuit. First and second voltage supply terminals are provided, which supply a voltage level consistent with the voltage requirements of a first-generation integrated circuit. An additional terminal is provided, with a filter capacitor connected between the additional terminal and the second voltage supply terminal. In the event that a first generation integrated circuit is used, the first and second voltage supply terminals provide power for the integrated circuit, while a direct connection is made within the integrated circuit between the terminal pins that make contact with the first voltage supply terminal and the additional terminal.

In the event that a subsequent-generation integrated circuit is used, a voltage reducer circuit is integrated into the subsequent-generation integrated circuit, with an input of the voltage reducer circuit connected to the first voltage supply terminal, and an output of the voltage reducer circuit providing a reduced voltage to the integrated circuit, according to the requirements of the integrated circuit. The output of the voltage reducer circuit is also connected to the additional terminal, where the filter capacitor provides filtering for the reduced voltage.

BRIEF DESCRIPTION OF THE DRAWINGS

The invention will be understood better from the following detailed description of an embodiment thereof, given with reference to the appended drawings, in which.

DETAILED DESCRIPTION OF THE INVENTION

Figure 1:
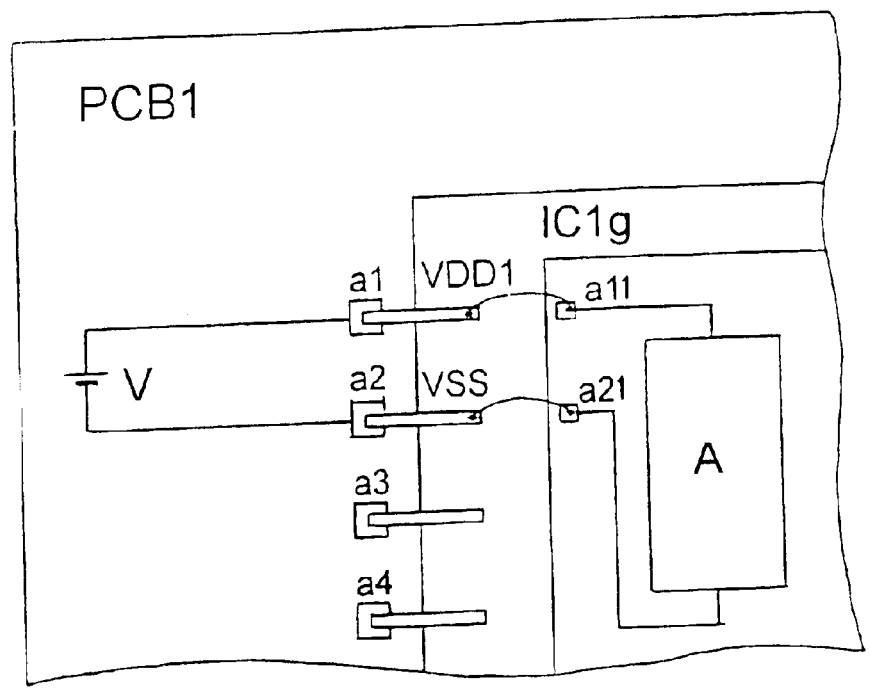
FIGS. 1 and 2 show schematically two circuit systems of the prior art comprising integrated circuits of two different generations.

FIG. 1 shows schematically a printed circuit board, indicated PCB1, which contains an integrated-circuit device IC1g (the suffix 1g indicates that the integrated circuit device is of the "first generation") and a voltage supply V. The device IC1g has a plurality of terminal pins connected to corresponding connection areas, or contact pads, of the board PCB1. The drawing shows only four pins connected to corresponding areas a1–a4 of the board PCB1. Two of these pins, indicated VDD1 and VSS, are connected to areas a1, a2 which are connected to the voltage supply V. The active portion of the integrated circuit is represented by a block A with terminals a11, a21 connected to the pins VDD1 and VSS. The board PCB1 contains various other components, not shown, which, together with the device IC1g, constitute the circuit system of an electronic device, for example, a cellular telephone. The voltage of the supply V is set at the design stage so as to be suitable for the characteristics of the device IC1g. In this embodiment, the supply V is shown as a component mounted on the board PCB1 but, naturally, it could also be external to the board.

Figure 2:
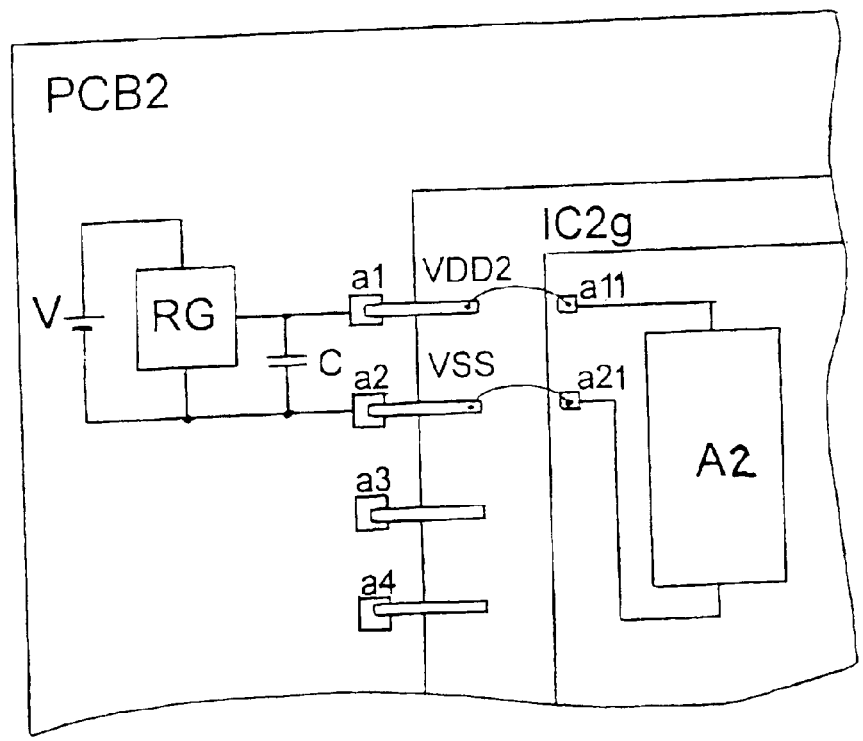

FIG. 2 shows how the circuit of the printed circuit board, indicated PCB2 in this case, has to be modified in order to use a second-generation integrated-circuit device IC2g produced by a reduction in scale of the dimensions of the first-generation device IC1g. The device IC2g is functionally equivalent to the device IC1g and has the same pin arrangement as the device IC1g, but its active portion A2 requires a lower supply voltage. For this purpose, the supply voltage V is reduced and stabilized by a regulator RG which has its output terminals connected to the supply terminals VDD2 and VSS of the device IC2g, and by a filter capacitor C connected in parallel with the output of the regulator.

Figure 3:
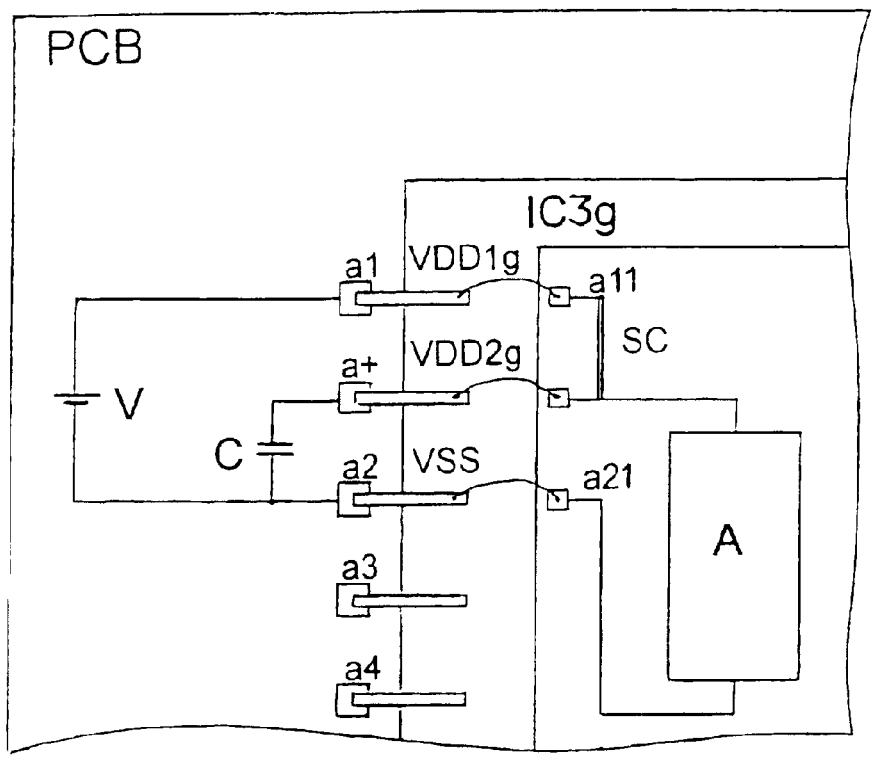
FIGS. 3 and 4 show schematically two circuit systems according to the invention comprising integrated circuits of two different generations.

According to the invention, as shown in FIG. 3, in which parts identical to those of FIG. 1 are identified by the same reference symbols, both the printed circuit board PCB and the first-generation integrated circuit IC3g are designed taking account of possible future reductions in scale of the integrated circuit. More particularly, the device IC3g has an additional pin, indicated VDD2g, and an internal connection SC which short-circuits the pins VDD1g and VDD2g. The board PCB in turn has an additional connection area a+ to which the additional pin VDD2g is fixed and a capacitor C connected between the additional area a+ and the area a2 which is connected to the supply pin VSS. Naturally, the additional pin VDD2g is entirely superfluous from the point of view of the operation of this circuit system and the capacitor C has the sole function of stabilizing the supply voltage. The capacitor C may be omitted if the stabilization function is not necessary and if there is no provision for integrated-circuit devices of generations subsequent to that of the device IC3g to be mounted on the board PCB.

Only four pins, a1–a4 are shown in FIG. 3 for simplicity sake. Of course, other pins are present on the board and chip and, as appropriate, the different voltages are provided to these additional pins.

Figure 4:
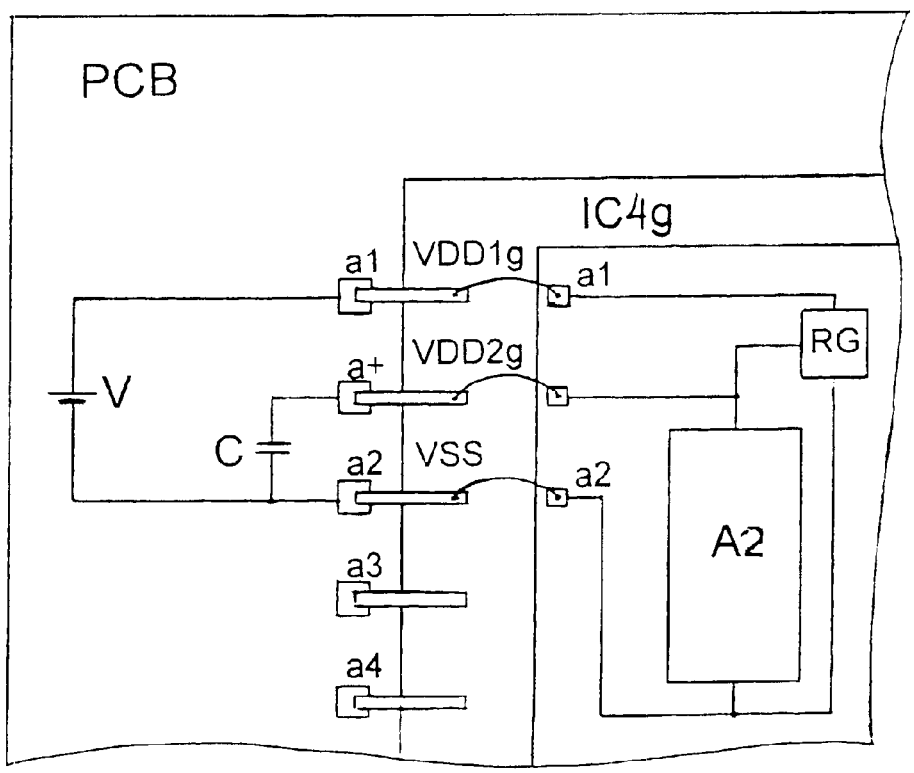

FIG. 4 shows the same board PCB as FIG. 3, on which an integrated-circuit device IC4g of a generation subsequent to that of the device IC3g of FIG. 3 and having an active portion A2 is mounted. In this case, the integrated-circuit device again has an additional pin VDD2g and has the same pin arrangement as the device IC3g, but contains a voltage reducer/regulator RG instead of the short-circuit SC. The supply voltage V is reduced and stabilized at the value required for the supply of the active portion A2 of the device IC4e. In this case, the capacitor C, which may have a value of between 1 and 10 μF, performs the function of filtering interference present at the supply terminals, for example, such as interference due to switching of the transistors of the logic gates in the circuit block A2.

It should be noted that the higher supply voltage available at the terminal VDD1g can advantageously be used to supply any portions or pins of the integrated circuit which have not been reduced in scale, for example, because they are intended for digital input-output interface functions.

According to the invention, the printed circuit board, PCB does not have to be modified when the integrated circuit mounted thereon is replaced by an equivalent device of a subsequent technological generation, since the modifications necessary for the adaptation are made within the integrated circuit itself by the addition of a voltage regulator circuit. It should be noted that the area required by the regulator is generally very small and, in any case, smaller than the area saved by the reduction in scale. For example, by changing from 0.35 μm technology to 0.25 μm technology, an integrated circuit which originally occupied an area of 100 mm$^2$ can be produced in an area of 50 mm$^2$, whereas the area required for a regulator is 2–3 mm$^2$.

In the event that a printed circuit board is later designed and produced to provide the lower voltage levels of the newer integrated circuit device, the lower supply voltage can be presented on the a+ terminal of chip IC4g, which will bypass the voltage regulator circuit and provide direct supply to the integrated circuit device. The same chip can continue to be used, on the new printer circuit board while the cost savings of not having to design a new printed circuit board with each new chip voltage has been realized.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method of using, in a circuit system which is designed to operate with a first integrated-circuit device operating at a first supply voltage, a second integrated-circuit device functionally equivalent to the first integrated-circuit device and comprising at least a portion operating at a second supply voltage lower than the first supply voltage, comprising:

providing, in the circuit system, a plurality of areas for connection to corresponding terminals of the first integrated-circuit device or of the second integrated-circuit device, two of these areas, which correspond to the supply terminals of one or of the other of the integrated-circuit devices, being connected to the first voltage supply, and a third area, which corresponds to another terminal of one or of the other of the integrated-circuited devices, being connected to circuit means of the circuit system, forming, in the first integrated-circuit device, a direct electrical connection between the said other terminal and one of the terminals connected to the first voltage supply, and forming, in the second integrated-circuit device, a voltage-reducer circuit with regulator the output of which is connected to the said other terminal.

2. A circuit system comprising:

a voltage supply;

an integrated-circuit device having a plurality of terminals of which two are connected to the voltage supply, wherein the integrated-circuit device is one of a family of functionally equivalent devices that comprises a first-generation integrated-circuit device operating at the supply voltage; and at least one subsequent-generation integrated-circuit device at least a portion of which operates at a voltage lower than the supply voltage, the first-generation device having a direct electrical connection between one of the terminals connected to the supply and another terminal of the plurality of terminals, and the subsequent-generation device comprising a voltage-reducer circuit with regulator (RG) the output of which is connected to the said other terminal.

3. A circuit system according to claim 2, comprising capacitive means external to the integrated-circuit device and connected between the said other terminal and one of the terminals connected to the supply.

4. A method comprising:

affixing a first integrated circuit requiring a voltage supply of a first value to a printed circuit board, where the printed circuit board is configured to receive a second integrated circuit and provide the second integrated circuit with a voltage supply of a second value and wherein the second value is greater than the first value;

providing a voltage supply of the second value to the first integrated circuit; and converting the voltage supply of the second value to a value equal to the voltage supply of the first value using a voltage-reducer circuit in the first integrated circuit.

5. The method of claim 4, wherein the first and second integrated circuits are functionally identical.

6. A device comprising:

a printed circuit board configured to receive a first integrated circuit device and supply the integrated circuit device with a voltage supply of a first value;

a second integrated circuit device, functionally identical to the first integrated circuit device, configured to require a voltage supply of a second value, where the second value is lower than the first value, affixed to the printed circuit board in place of the first integrated circuit device; and a voltage reducer circuit, integrated within the second integrated circuit device, having a voltage input connected to the voltage supply of the first value, and having a voltage output, provided to the second integrated circuit device, of the second value.

7. The device of claim 6, further comprising capacitive means between the voltage output and a circuit ground common to the second integrated circuit device and the printed circuit board.

8. The device of claim 7 wherein:

the printed circuit board comprises a plurality of contact pads;

the second integrated circuit device comprises a plurality of terminal pins;

each of the plurality of terminal pins is in electrical contact with one of the plurality of contact pads;

the voltage input of the voltage reducer circuit is connected to the voltage supply of the printed circuit board via one of the plurality of terminal pins and one of the plurality of contact pads;

the output of the voltage reducer circuit is connected to the capacitive means via a second one of the plurality of terminal pins, and a second one of the plurality of contact pads; and the circuit ground of the integrated circuit device is connected to the circuit ground of the printed circuit board via a third one of the plurality of terminal pins, and a third one of the plurality of contact pads.

* * * * *